US010483151B2

(12) United States Patent
Furuya

(10) Patent No.: US 10,483,151 B2
(45) Date of Patent: Nov. 19, 2019

(54) SUBSTRATE TRANSFER APPARATUS, SUBSTRATE PROCESSING APPARATUS, AND SUBSTRATE PROCESSING METHOD

(71) Applicant: SHIBAURA MECHATRONICS CORPORATION, Yokohama-shi (JP)

(72) Inventor: Masaaki Furuya, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 33 days.

(21) Appl. No.: 15/472,671

(22) Filed: Mar. 29, 2017

(65) Prior Publication Data

US 2017/0287767 A1    Oct. 5, 2017

(30) Foreign Application Priority Data

Mar. 31, 2016   (JP) ................. 2016-073092

(51) Int. Cl.
| | |
|---|---|
| H01L 21/68 | (2006.01) |
| H01L 21/687 | (2006.01) |
| H01L 21/67 | (2006.01) |
| H01L 21/677 | (2006.01) |

(52) U.S. Cl.
CPC .. H01L 21/68707 (2013.01); H01L 21/67173 (2013.01); H01L 21/67184 (2013.01); H01L 21/67742 (2013.01); H01L 21/67748 (2013.01); H01L 21/67769 (2013.01); H01L 21/67778 (2013.01); H01L 21/68742 (2013.01); *B60K 2370/167* (2019.05); *B60K 2370/182* (2019.05)

(58) Field of Classification Search
CPC ............................................... H01L 21/68707
USPC ................... 414/941; 294/103.1, 119.1, 213
See application file for complete search history.

(56) References Cited

U.S. PATENT DOCUMENTS

| | | | | |
|---|---|---|---|---|
| 5,700,046 A | * | 12/1997 | Van Doren | ............ B25J 15/026 294/119.1 |
| 2002/0071756 A1 | * | 6/2002 | Gonzalez | .......... H01L 21/68707 294/213 |
| 2008/0199284 A1 | * | 8/2008 | Mitsuyoshi | ....... H01L 21/67051 414/223.02 |
| 2010/0150687 A1 | | 6/2010 | Sakata et al. | |

(Continued)

FOREIGN PATENT DOCUMENTS

| | | |
|---|---|---|
| JP | 5823742 | 11/2015 |
| TW | 201611173 A | 3/2016 |

*Primary Examiner* — Ronald P Jarrett
(74) *Attorney, Agent, or Firm* — Oblon, McClelland, Maier & Neustadt, L.L.P.

(57) ABSTRACT

According to one embodiment, a substrate transfer apparatus includes: a first gripping plate; a first claw that is supported by the first gripping plate, and has an abutment surface abutting on the outer peripheral surface of a substrate located above and below a surface of the first gripping plate; a second gripping plate arranged as overlapping with the first gripping plate; a second claw that is supported by the second gripping plate, and has an abutment surface abutting on the outer peripheral surface of the substrate located above and below the surface of the first gripping plate; and a gripping part configured to move the first gripping plate and the second gripping plate relative to each other such that the first claw and the second claw move close to and away from each other in a direction intersecting the outer peripheral surface of the substrate.

13 Claims, 9 Drawing Sheets

(56) References Cited

U.S. PATENT DOCUMENTS

2012/0004773 A1  1/2012  Furuya
2013/0204421 A1  8/2013  Hayashi et al.

* cited by examiner

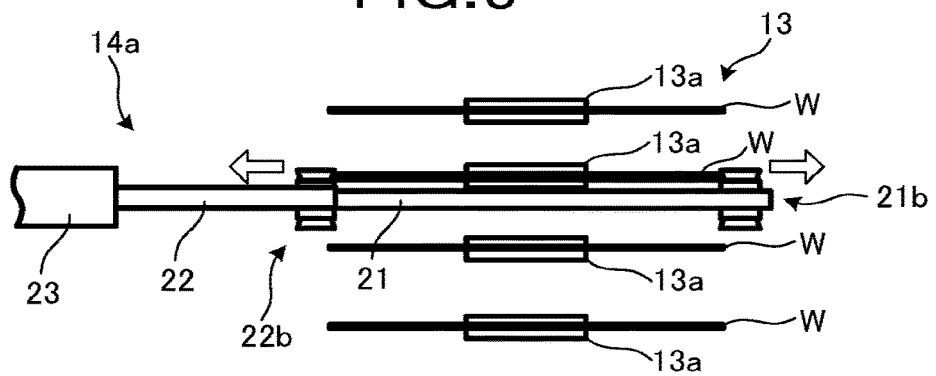
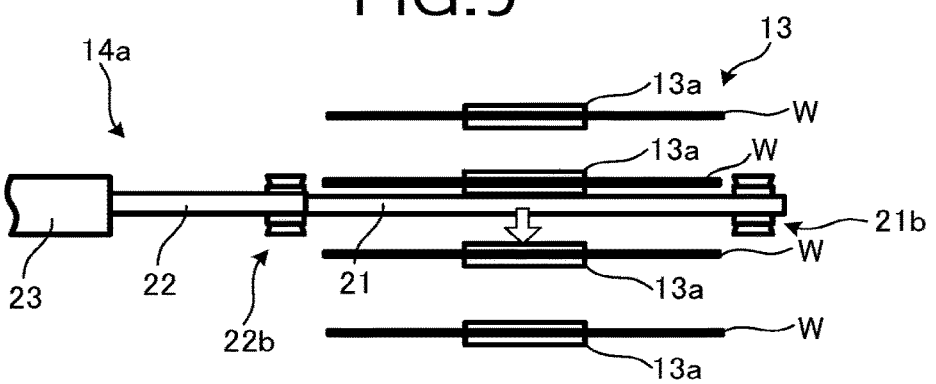
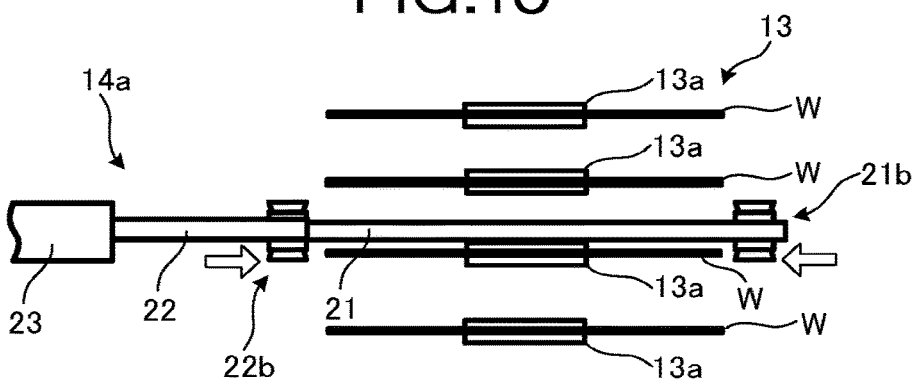

SUBSTRATE TRANSFER APPARATUS, SUBSTRATE PROCESSING APPARATUS, AND SUBSTRATE PROCESSING METHOD

CROSS-REFERENCE TO THE RELATED APPLICATION

This application is based upon and claims the benefit of priority from Japanese Patent Application No. 2016-073092, filed on Mar. 31, 2016; the entire contents of which are incorporated herein by reference.

FIELD

Embodiments described herein relate generally to a substrate transfer apparatus, a substrate processing apparatus, and a substrate processing method.

BACKGROUND

A substrate processing apparatus is used in the process of manufacturing semiconductors, liquid crystal panels, and the like to supply a treatment liquid (e.g., resist stripping liquid, a rinsing liquid, washing liquid, etc.) to a surface of a substrate, such as a wafer or a liquid crystal substrate, to thereby treat the surface. From the viewpoint of uniformity and reproducibility, the substrate processing apparatus uses a single wafer system in which substrates are processed one by one in a dedicated processing chamber. Besides, in order to standardize the substrate transfer system, substrates are transported as being stored in a common special case (e.g., FOUP, etc.). In this special case, the substrates are stored in such a manner that they are stacked at predetermined intervals.

The substrate processing apparatus uses a substrate transfer apparatus such as a transfer robot. The substrates are taken out from the special case and transported to the processing chamber. After that, the processed substrates are stored in the special case. At this time, the substrate processing is not limited to one type, but a plurality of types of processing steps (e.g., resist stripping step, rinsing step, washing step, etc.) may be each performed in a dedicated processing chamber for each type, and returned to the special case.

The substrate transfer apparatus performs the operation of exchanging processed substrates and unprocessed substrates in the special case, the processing chamber, a buffer in the middle of them, and the like. When exchanging the substrates, the substrate transfer apparatus alternately moves two hands for the processed substrate and the untreated substrate with two arms. That is, two hands are alternately used to exchange the substrates once, and the hands are taken in and out twice. Therefore, the substrates are not transferred efficiently, and the time taken for the substrate transfer is prolonged. This reduces the productivity of the substrate processing apparatus.

BRIEF DESCRIPTION OF THE DRAWINGS

FIG. 8 is a second explanatory diagram for explaining a flow of the first transfer operation;

FIG. 9 is a third explanatory diagram for explaining a flow of the first transfer operation;

FIG. 10 is a fourth explanatory diagram for explaining a flow of the first transfer operation;

DETAILED DESCRIPTION

According to one embodiment, a substrate transfer apparatus includes: a first gripping plate; a first claw that is supported by the first gripping plate, and has an abutment surface, which abuts on the outer peripheral surface of a substrate, located above and below a surface of the first gripping plate; a second gripping plate arranged as overlapping with the first gripping plate; a second claw that is supported by the second gripping plate, and has an abutment surface, which abuts on the outer peripheral surface of the substrate, located above and below the surface of the first gripping plate; and a gripping part configured to move the first gripping plate and the second gripping plate relative to each other such that the first claw and the second claw move close to and away from each other in a direction intersecting the outer peripheral surface of the substrate.

According to another embodiment, a substrate processing apparatus includes: a storage configured to store a plurality of substrates stacked at predetermined intervals; the substrate transfer apparatus described above; and a substrate processing unit configured to process the substrates According to still another embodiment, a substrate processing method includes: taking a first substrate out from a storage that stores a plurality of substrates stacked at predetermined intervals using the substrate transfer apparatus described as above; performing a process on the first substrate taken out from the storage; storing the first substrate subjected to the process in the storage using the substrate transfer apparatus; taking a second substrate located above or below the first substrate stored in the storage out from the storage using the substrate transfer apparatus; performing a process on the second substrate taken out from the storage; and storing the second substrate subjected to the process in the storage using the substrate transfer apparatus.

First Embodiment

A first embodiment is described with reference to FIGS. 1 to 12.
(Basic Configuration)

Figure 1:
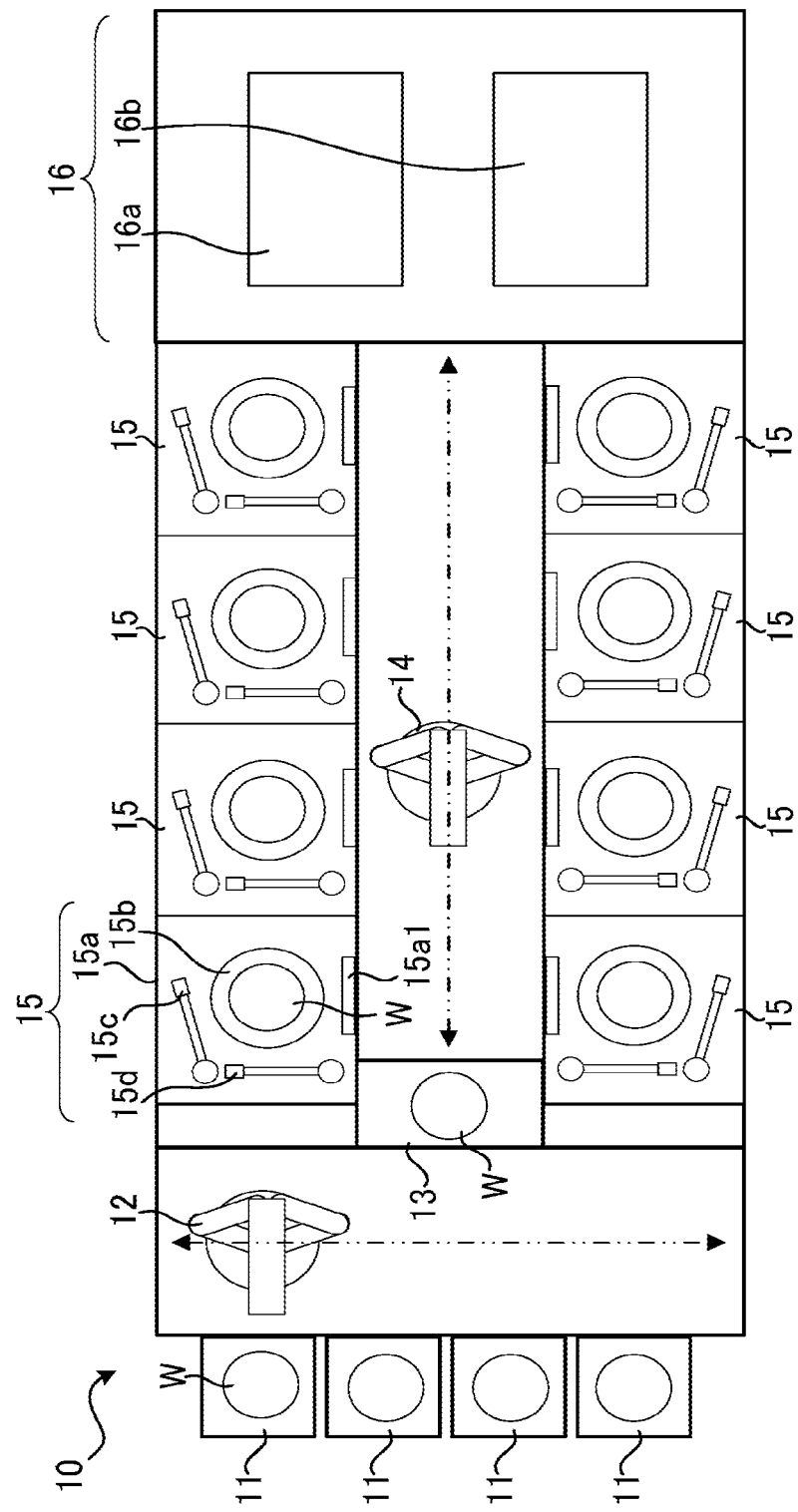
FIG. 1 is a plan view illustrating a schematic configuration of a substrate processing apparatus according to a first embodiment.

As illustrated in FIG. 1, according to the first embodiment, a substrate processing apparatus 10 includes a plurality of opening/closing units (storage) 11, a first transfer robot (substrate transfer apparatus) 12, a buffer unit (storage) 13, a second transfer robot (substrate transfer apparatus) 14, a plurality of substrate processing units 15, and a device accessory unit 16.

The opening/closing units 11 are arranged in a row. The opening/closing units 11 open and close the door of a special case (e.g., FOUP) functioning as a transport container. When the special case is a FOUP, the opening/closing units 11 are called FOUP opener. In this special case, substrates W are stored as being stacked at predetermined intervals.

The first transfer robot 12 is provided next to the row of the opening/closing units 11 so as to move along a first transfer direction in which the opening/closing units 11 are arranged. The first transfer robot 12 takes out an unprocessed substrate W from the special case, the door of which has been opened by one of the opening/closing units 11. The first transfer robot 12 moves in the first transfer direction to the vicinity of the buffer unit 13 as necessary, and stops. Then, the first transfer robot 12 turns at the stop position and transfers the unprocessed substrate W into the buffer unit 13. In addition, the first transfer robot 12 takes out a processed substrate W from the buffer unit 13, moves in the first transfer direction to the vicinity of a desired one of the opening/closing units 11 as necessary, and stops. Then, the first transfer robot 12 turns at the stop position and transfers the processed substrate W into a desired special case. Note that the first transfer robot 12 may turn without moving to transfer the unprocessed substrate W to the buffer unit 13 or the processed substrate W to the desired special case. As the first transfer robot 12, for example, a robot having a robot arm, a robot hand, a movement mechanism, or the like can be used.

The buffer unit 13 is located near the center of a first robot movement path where the first transfer robot 12 moves. Specifically, the buffer unit 13 is provided on one side of the first robot movement path, i.e., on one side opposite to each of the opening/closing units 11. The buffer unit 13 functions as a buffer table (substrate transfer table) for exchanging the substrates W between the first transfer robot 12 and the second transfer robot 14. In the buffer unit 13, the substrates W are stored as being stacked at predetermined intervals.

The second transfer robot 14 is provided so as to move from the vicinity of the buffer unit 13 in a second transfer direction (an example of a direction crossing the first transfer direction) perpendicular to the first transfer direction. The second transfer robot 14 takes out an unprocessed substrate W from the buffer unit 13. The second transfer robot 14 moves in the second transfer direction to the vicinity of a desired one of the substrate processing units 15 as necessary, and stops. Then, the second transfer robot 14 turns at the stop position and transfers the unprocessed substrate W into the desired one of the substrate processing units 15. In addition, the second transfer robot 14 takes out a processed substrate W from the substrate processing unit 15, moves in the second transfer direction to the vicinity of the buffer unit 13 as necessary, and stops. Then, the second transfer robot 14 turns at the stop position and transfers the processed substrate W into the buffer unit 13. Note that the second transfer robot 14 may turn without moving to transfer the unprocessed substrate W to the desired one of the substrate processing units 15 or the processed substrate W to the buffer unit 13. As the second transfer robot 14, for example, a robot having a robot arm, a robot hand, a movement mechanism or the like can be used (described later in details).

For example, four substrate processing units 15 are provided on each side of a second robot movement path where the second transfer robot 14 moves. Each of the substrate processing units 15 includes a processing chamber 15a, a substrate holding part 15b, a first treatment liquid supply unit 15c, and a second treatment liquid supply unit 15d. The substrate holding part 15b, the first treatment liquid supply unit 15c, and the second treatment liquid supply unit 15d are arranged in the processing chamber 15a.

The processing chamber 15a is, for example, formed in a rectangular parallelepiped shape and has a substrate shutter 15a1. The substrate shutter 15a1 is formed to be openable and closable on the wall surface of the processing chamber 15a on the side of the second robot movement path. The interior of the processing chamber 15a is kept clean by downflow (vertical laminar flow), and is kept at a negative pressure as compared with the outside.

The substrate holding part 15b has a mechanism of holding the substrate W in a horizontal state by a pin (not illustrated) or the like, and rotating the substrate W in a horizontal plane about an axis that vertically intersects substantially the center of the processed surface of the substrate W (an example of an axis intersecting the processed surface of the substrate W) as a rotation center. For example, the substrate holding part 15b rotates the substrate W held in a horizontal state by a rotation mechanism (not illustrated) having a rotation axis, a motor, and the like.

The first treatment liquid supply unit 15c supplies a first treatment liquid to the vicinity of the center of the surface to be processed of the substrate W on the substrate holding part 15b. The first treatment liquid supply unit 15c has, for example, a nozzle for ejecting the treatment liquid, and moves the nozzle to the vicinity of the center of the surface to be processed of the substrate W on the substrate holding part 15b to supply the treatment liquid from this nozzle. The first treatment liquid supply unit 15c is supplied with the first treatment liquid from a liquid supply unit 16a through piping (not illustrated).

The second treatment liquid supply unit 15d supplies a second treatment liquid to the vicinity of the center of the surface to be processed of the substrate W on the substrate holding part 15b. The second treatment liquid supply unit 15d has, for example, a nozzle for ejecting the treatment liquid, and moves the nozzle to the vicinity of the center of the surface to be processed of the substrate W on the substrate holding part 15b to supply the treatment liquid from this nozzle. The second treatment liquid supply unit 15d is supplied with the second treatment liquid from the liquid supply unit 16a through piping (not illustrated).

The device accessory unit 16 is provided at one end of the second robot movement path, i.e., at the end opposite to the buffer unit 13. The device accessory unit houses the liquid supply unit 16a and a control unit (controller) 16b. The liquid supply unit 16a supplies various treatment liquids (e.g., resist stripping liquid, a rinsing liquid, washing liquid, etc.) to each of the substrate processing units 15. The control unit 16b includes a microcomputer for intensively controlling each unit and a storage (not illustrated) for storing various programs and substrate processing information related to substrate processing. The control unit 16b controls each unit such as each of the opening/closing units 11, the first transfer robot 12, the second transfer robot 14, each of the substrate processing units 15, and the like, based on the various programs and the substrate processing information.

(Substrate Transfer Apparatus)

Next, the second transfer robot 14 is described with reference to FIGS. 2 to 6. FIG. 3 illustrates the second transfer robot 14 in such a manner that its gripping mechanism is visible.

Figure 2:
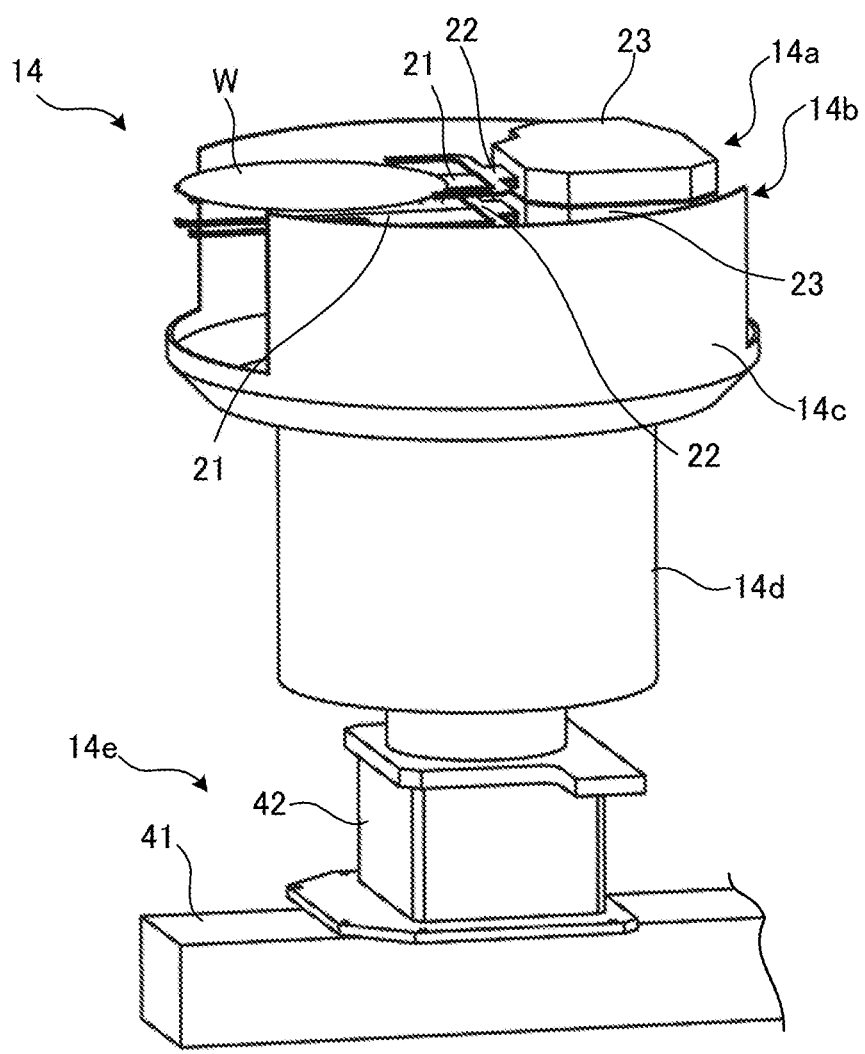
FIG. 2 is a perspective view illustrating a transfer robot of the first embodiment.
Figure 3:
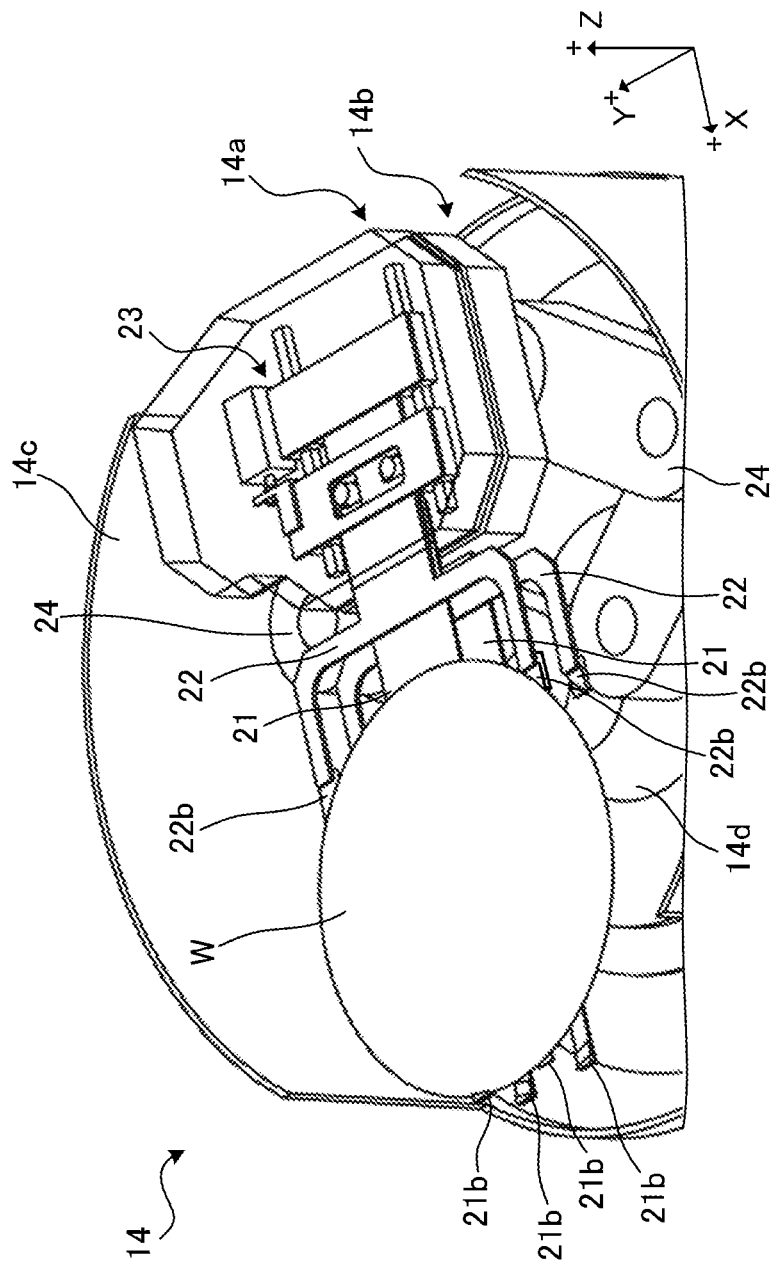
FIG. 3 is a perspective view illustrating a part of the transfer robot of the first embodiment.

As illustrated in FIGS. 2 and 3, the second transfer robot 14 includes a first arm unit 14a, a second arm unit 14b, a liquid receiving cover 14c, an lifting and rotating part 14d, and a movement mechanism 14e. The second transfer robot 14 is a double-arm robot having two arm units (14a, 14b) in upper and lower two stages. The first arm unit 14a and the second arm unit 14b basically have the same structure, and therefore, the structure of one of them, the first arm unit 14a, is described.

The first arm unit 14a includes a first gripping plate 21, a second gripping plate 22, a gripping part 23, and an arm 24. The first gripping plate 21 and the second gripping plate 22 function as hands (see FIG. 4). A part of the first arm unit 14a (the first gripping plate 21, the second gripping plate 22, and the gripping part 23) and a part of the second arm unit 14b (the first gripping plate 21, the second gripping plate 22, and the gripping part 23) are located one above the other. Details of each of the portions 21 to 24 of the first arm unit 14a are described later.

The liquid receiving cover 14c is provided so as to surround the first arm unit 14a and the second arm unit 14b, and is formed so as not to hinder the extension and contraction of each of the arms 24. Because of the presence of the liquid receiving cover 14c, even if the liquid drops from the substrate W and splashes in the course of transferring the wet substrate W after the processing, the liquid hits the liquid receiving cover 14c. Thereby, it is possible to suppress the liquid dropped from the substrate W from being scattered to the movement mechanism 14e and the floor of the room.

The lifting and rotating part 14d holds the arm 24 of the first arm unit 14a and the second arm unit 14b to move it along the vertical axis A1, and lifts the first arm unit 14a and the second arm unit 14b together with the liquid receiving cover 14c. Further, the lifting and rotating part 14d rotates about a vertical axis as a rotation axis (robot rotation axis) to rotate each of the arms 24 together with the liquid receiving cover 14c. The lifting and rotating part 14d incorporates an elevation mechanism and a rotation mechanism (none of which are illustrated). The lifting and rotating part 14d is electrically connected to the control unit 16b (see FIG. 1), and is driven under the control of the control unit 16b. Incidentally, the lifting and rotating part 14d functions as an lifting part.

As illustrated in FIG. 2, the movement mechanism 14e includes a linear rail (moving shaft) 41 and a movement drive part 42. The linear rail 41 is a rail extending along the second transfer direction mentioned above. Further, the movement drive part 42 rotatably supports the lifting and rotating part 14d, and is located on the linear rail 41 so as to be movable along the linear rail 41. The movement mechanism 14e moves the lifting and rotating part 14d along the linear rail 41 by the movement drive part 42. The movement mechanism 14e is electrically connected to the control unit 16b (see FIG. 1), and is driven under the control of the control unit 16b.

(First Arm Unit)

Next, the first arm unit 14a is described in detail.

Figure 4:
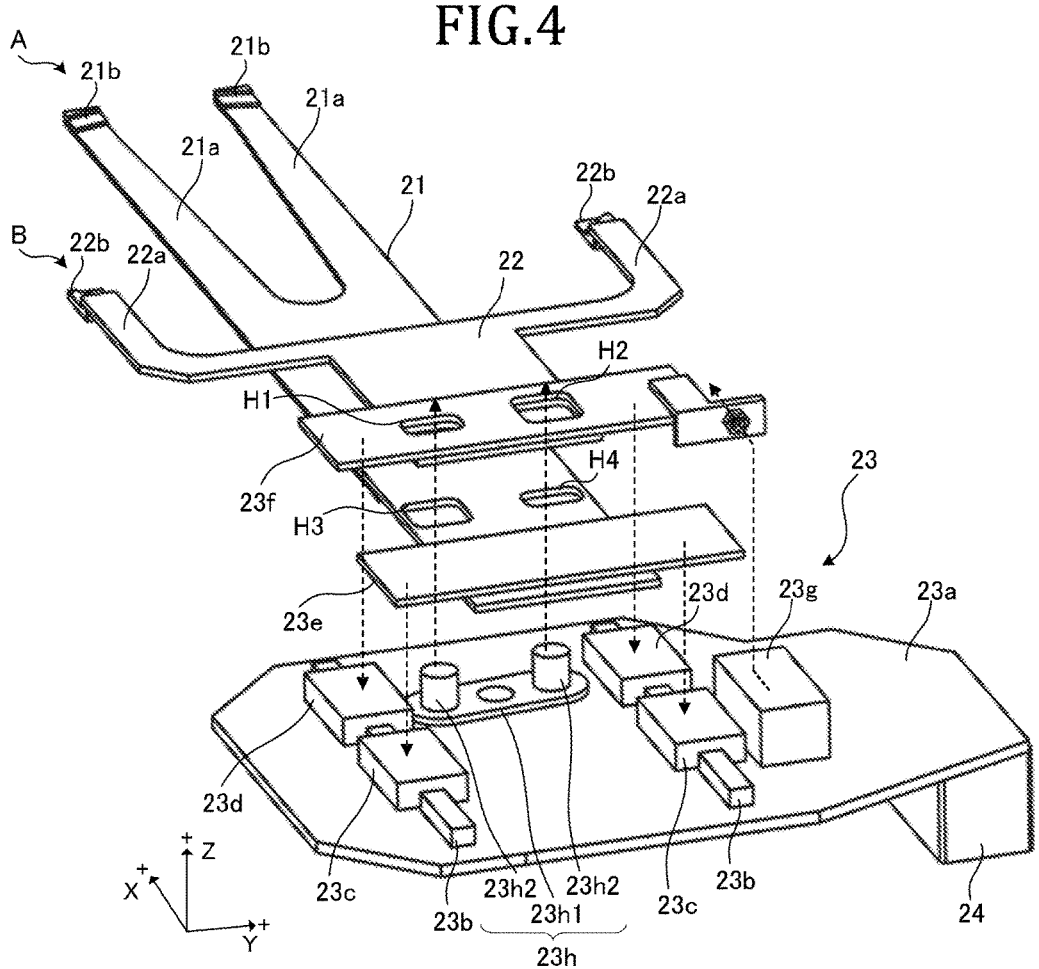
FIG. 4 is an exploded perspective view illustrating a part of the transfer robot of the first embodiment.
Figure 5:
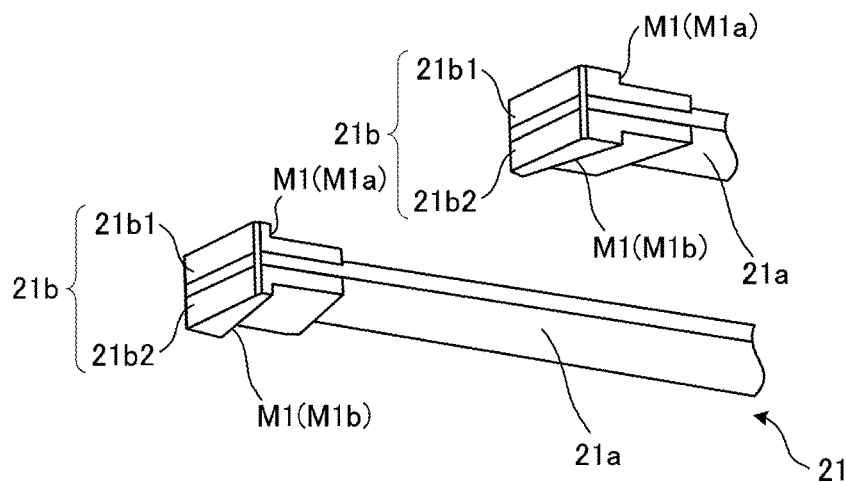
FIG. 5 is a perspective view illustrating a first claw of the first embodiment.

As illustrated in FIG. 4, the first gripping plate 21 has two first fingers 21a. A first claw 21b is provided to the tip of each of the fingers 21a. As illustrated in FIG. 5, the first claw 21b has abutment surfaces M1 (M1a, M1b), which abut on the outer peripheral surface (side surface) of the substrate W and are located one above the other. FIG. 5 illustrates two first fingers 21a viewed from the direction A (diagonally downward direction) in FIG. 4. As illustrated in FIG. 5, the first claw 21b includes an upper claw 21b1 and a lower claw 21b2. The upper claw 21b1 is arranged on the upper surface (front surface) of the first gripping plate 21, and has an abutment surface M1a. Further, the lower claw 21b2 is located on the lower surface (the back surface opposite to the front surface) of the first gripping plate 21, and has an abutment surface M1b.

As described above, the first claw 21b has the abutment surfaces M1 (M1a, M1b) above and below (in the Z direction) the horizontal plane (X-Y plane) of the first gripping plate 21 as a reference plane. The upper claw 21b1 is located above the horizontal plane of the first gripping plate 21. The lower claw 21b2 is supported by the first gripping plate 21 so as to be located below the horizontal plane of the first gripping plate 21.

The upper surface (front surface) of the first gripping plate 21 extends in the X-Y plane so as to face the main surface (the surface opposite to the surface to be processed) of the substrate W when the substrate W is held on the upper side. Further, the lower surface (the back surface opposite to the front surface) of the first gripping plate 21 extends in the X-Y plane so as to face the main surface (front surface) of the substrate when the substrate W is held on the lower side.

Figure 6:
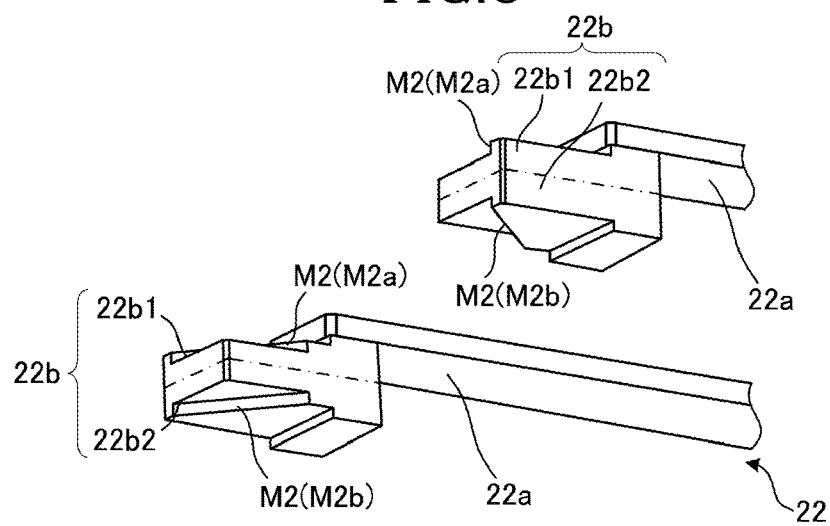
FIG. 6 is a perspective view illustrating a second claw of the first embodiment.

As illustrated in FIG. 4, the second gripping plate 22 is provided on the upper surface of the first gripping plate 21 so as to overlap with the first gripping plate 21. Similarly to the first gripping plate 21, the second gripping plate 22 has two second fingers 22a. A second claw 22b is provided to the tip of each of the fingers 22a. As illustrated in FIG. 6, the second claw 22b has abutment surfaces M2 (M2a, M2b), which abut on the outer peripheral surface (side surface) of the substrate W and are located one above the other. FIG. 6 illustrates two second fingers 22a viewed from the direction B (diagonally downward direction) in FIG. 4. As illustrated in FIG. 6, the second claw 22b is a claw block in which an upper claw 22b1 and a lower claw 22b2 are integrally formed. The upper claw 22b1 and the lower claw 22b2 have abutment surfaces M2 (M2a, M2b), respectively. The second claw 22b is located on the lower surface (back surface) of the second gripping plate 22.

As described above, as in the first claw 21b, the second claw 22b also has the abutment surfaces M2 in the vertical direction (Z direction) with the horizontal plane (X-Y plane) of the first gripping plate 21 as a reference plane (M2a, M2b). The upper claw 22b1 is located above the horizontal plane of the first gripping plate 21. The lower claw 22b2 is supported by the second gripping plate 22 so as to be located below the horizontal plane of the first gripping plate 21.

As illustrated in FIGS. 3 and 4, the gripping part 23 moves the first gripping plate 21 and the second gripping plate 22 relative to each other such that each of the first claws 21b and each of the second claws 22b move close to and away from each other in a direction crossing the outer peripheral surface of the substrate W (e.g., in the horizontal direction).

For example, when each of the first claws 21b and each of the second claws 22b move in a direction in which they move close to each other, the substrate W positioned therebetween is gripped. At this time, the abutment surfaces M1 (M1a, M1b) and the abutment surfaces M2 (M2a, M2b) of the first claw 21b and the second claw 22b are in contact with the outer peripheral surface of the substrate W. On the other hand, when each of the first claws 21b and each of the second claws 22b move away from each other, the gripping of the substrate W between them is released.

As illustrated in FIG. 4, the gripping part 23 includes a support plate 23a, a pair of linear guides 23b, a pair of first linear motion blocks 23c, a pair of second linear motion blocks 23d, a first connecting plate 23e, a second connecting plate 23f, an air cylinder 23g, and a swing pin mechanism 23h.

The support plate 23a is held by the arm 24. The pair of linear guides 23b are located on the support plate 23a extending in a rail shape in the X direction.

The pair of first linear motion blocks 23c are each located on each of the pair of linear guides 23b so as to be movable in the extending direction of the linear guides 23b. The pair of first linear motion blocks 23c are members for movably supporting the first gripping plate 21.

The pair of second linear motion blocks 23d are each located on each of the linear guides 23b so as to be movable in the extending direction of the linear guides 23b. The pair of second linear motion blocks 23d are members for movably supporting the second gripping plate 22.

The first connecting plate 23e connects the pair of first linear motion blocks 23c and the first gripping plate 21. The second connecting plate 23f connects the pair of second linear motion blocks 23d and the second gripping plate 22.

In the second connecting plate 23f and the second gripping plate 22, two through holes H1 and H2 having different opening sizes are formed so as to line up in the Y direction. The through hole H1 is smaller than the through hole H2.

Also in the first gripping plate 21, two through holes H3 and H4 are formed so as to correspond to the positions of the through holes H1 and H2. The through holes H3 and H4 are formed to have opening sizes opposite to the opening sizes of the through holes H1 and H2. Accordingly, the through hole H4 is smaller than the through hole H3.

The air cylinder 23g has a rod (not illustrated) that is connected to the end of the second connecting plate 23f, and slides the second connecting plate 23f in the X direction. The air cylinder 23g is electrically connected to the control unit 16b (see FIG. 1), is driven under the control of the control unit 16b.

The swing pin mechanism 23h has a rotator 23h1 and two swing pins 23h2. The rotator 23h1 is located on the support plate 23a so as to be rotatable around its center as a rotation axis. The swing pins 23h2 are each located at a position on the rotator 23h1 so as to face each other with the rotation axis of the rotator 23h1 between them. The swing pins 23h2 are passed through the two through holes H1 and H3 and the other two through holes H2 and H4, respectively.

The through hole H2 is formed in a size such that the swing pin 23h2 does not contact the second gripping plate 22 and the second connecting plate 23f in a predetermined movement range of the rod of the air cylinder 23g. The through hole H3 is also formed in a size such that the swing pin 23h2 does not contact the first gripping plate 21 in a predetermined movement range of the rod of the air cylinder 23g.

When the air cylinder 23g slides the second connecting plate 23f and the pair of second linear motion blocks 23d by a predetermined amount of movement of the rod, the second gripping plate 22 moves in the horizontal direction. In response to this movement, the first gripping plate 21 is moved in a direction opposite to the moving direction of the second gripping plate 22 by the swing pin mechanism 23h together with the first connecting plate 23e and the pair of first linear motion blocks 23c. With this, the substrate W can be gripped or released.

Referring back to FIG. 3, the arm 24 is coupled to the lifting and rotating part 14d and is vertically movable along the vertical axis by the lifting and rotating part 14d. The arm 24 is extensible and retractable, and holds the gripping part 23 to move the gripping part 23 together with the first gripping plate 21 and the second gripping plate 22 in a horizontal linear direction. As a result, the first gripping plate 21 and the second gripping plate 22 move in the horizontal direction. By moving the first gripping plate 21 and the second gripping plate 22, i.e., the hands, forward and backward, the substrates W are carried into the buffer unit 13 and the processing chamber 15a, or taken out therefrom.

(Substrate Processing Step)

Described below is a flow of the substrate processing performed by the substrate processing apparatus 10. When two types of processing are performed on the substrate W, in FIG. 1, different processes are set to be performed in the four processing chambers 15a on the left side (hereinafter sometimes referred to as the "first processing chambers 15a") and the four processing chambers 15a on the right side (hereinafter sometimes referred to as the "second processing chambers 15a") located across a second robot movement path extending vertically. In the case of performing different processes, a first process is performed in the first processing chamber, while a process (second process) subsequent to the first process is performed in the second processing chamber.

First, an unprocessed substrate W is taken out from the special case in each of the opening/closing units 11 by the first transfer robot 12. The first transfer robot 12 moves along the first robot movement path as necessary and stops. Then, the first transfer robot 12 turns at the stop position and transfers the unprocessed substrate W into the buffer unit 13. Thereby, the unprocessed substrate W is stored in the buffer unit 13.

Thereafter, the unprocessed substrate W in the buffer unit 13 is taken out by the second transfer robot 14. The second transfer robot 14 moves along the second robot movement path as necessary and stops. Then, the second transfer robot 14 turns at the stop position and transfers the unprocessed substrate W into a desired one of the first processing chambers 15a. Thereby, the unprocessed substrate W is set in the first processing chamber 15a. Thereafter, the first process is performed on the substrate W in the first processing chamber 15a.

When the process in the first processing chamber 15a is completed, the processed substrate W is taken out from the first processing chamber 15a by the second transfer robot 14. The second transfer robot 14 turns 180° to carry the processed substrate W into the second processing chamber 15a. Thereby, the processed substrate W is set in the second processing chamber 15a. Thereafter, the second process is performed on the substrate W in the second processing chamber 15a.

When the process in the second processing chamber 15a is completed, the processed substrate W is taken out from the second processing chamber 15a by the second transfer robot 14. The second transfer robot 14 moves along the second robot movement path as necessary and stops. Then, the second transfer robot 14 turns at the stop position and transfers the processed substrate W into the buffer unit 13. With this, the processed substrate W is stored in the buffer unit 13.

Thereafter, the processed substrate W in the buffer unit 13 is taken out by the first transfer robot 12. The first transfer robot 12 moves along the first robot movement path as necessary and stops. Then, the first transfer robot 12 turns at the stop position and transfers the processed substrate W into a desired special case. With this, the processed substrate W is stored in the special case.

(Substrate Transfer Process by Second Transfer Robot)

In the following, with reference to FIGS. 7 to 12, a detailed description is given of a flow of substrate transfer performed by the second transfer robot 14 in the substrate processing step described above. First, the delivery of the substrate W between the second transfer robot 14 and the buffer unit 13 is described.

As illustrated in FIGS. 7 to 12, in the buffer unit 13, placement table members 13a are arranged at predetermined intervals in the height direction for storing the substrates W as being stacked at predetermined intervals. The placement table members 13a are located to face one another in a horizontal plane. A pair of the placement table members 13a located at the same height position support a part of the outer periphery of one substrate W to hold the substrate W. The substrate W is placed on the pair of the placement table members 13a from above the first arm unit 14a or the second arm unit 14b.

In the buffer unit 13, one or more unprocessed substrates W and one or more processed substrates W can be placed. In this embodiment, the space above the entering position of the first arm unit 14a or the second arm unit 14b is empty so that a processed substrate W can be placed on the placement table member 13a above the entering position. On the other hand, an unprocessed substrate W is placed on the placement table member 13a below the entering position of the first arm unit 14a or the second arm unit 14b.

Figure 7:
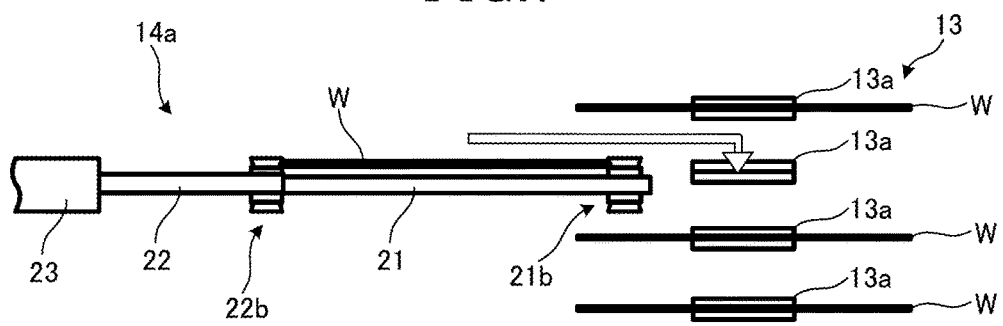
FIG. 7 is a first explanatory diagram for explaining a flow of a first transfer operation (transfer to a buffer unit) of the transfer robot of the first embodiment.
Figure 11:
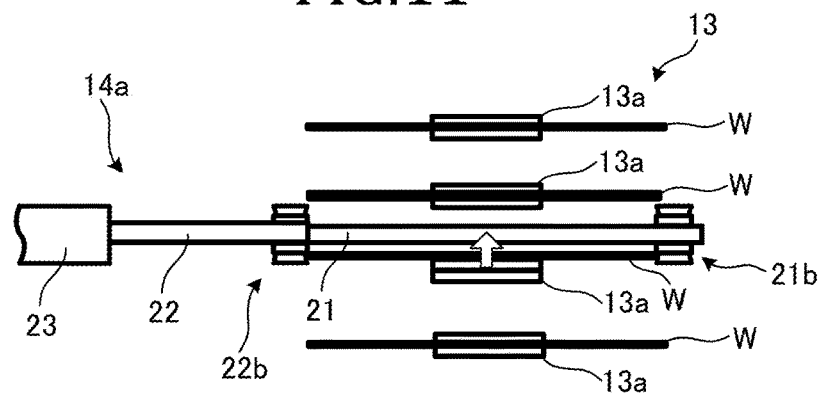
FIG. 11 is a fifth explanatory diagram for explaining a flow of the first transfer operation.
Figure 12:
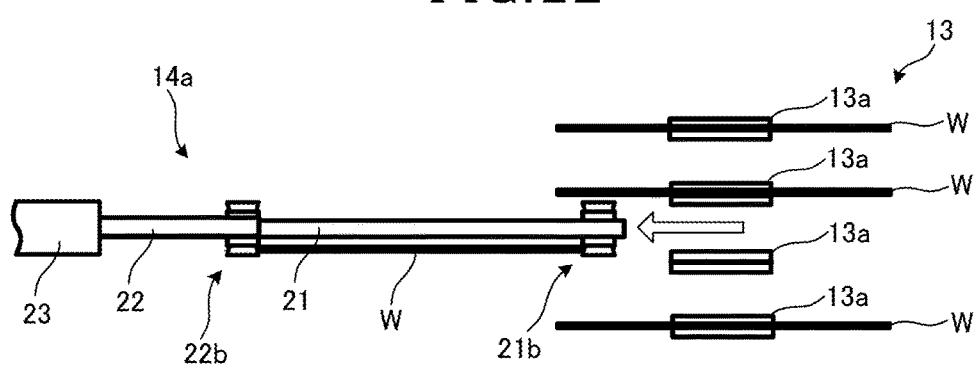
FIG. 12 is a sixth explanatory diagram for explaining a flow of the first transfer operation.

As illustrated in FIG. 7, in the transfer of the processed substrate W to the buffer unit 13, the first arm unit 14a that holds the processed substrate W on the upper side (each of the upper claws 21b1, each of the upper claws 22b1) places the processed substrate W on a pair of the placement table members 13a of the buffer unit 13. Then, as illustrated in FIG. 8, the gripping by the first arm unit 14a is released, and the processed substrate W is supported by the pair of the placement table members 13a. Thereafter, as illustrated in FIG. 9, the first arm unit 14a descends to a gripping position where the unprocessed substrate W on the pair of the placement table members 13a is gripped. Then, as illustrated in FIG. 10, the first arm unit 14a having descended to the gripping position grips the unprocessed substrate W on the pair of the placement table members 13a on the lower side (each of the lower claws 21b2, each of the lower claws 22b2). Next, as illustrated in FIG. 11, the first arm unit 14a holding the unprocessed substrate W on the lower side is raised by a predetermined distance to a position where the first arm unit 14a can move horizontally so as to be retractable. Then, as illustrated in FIG. 12, the first arm unit 14a holding the unprocessed substrate W on the lower side retreats from between the placement table members 13a in the height direction to thereby take out the unprocessed substrate W. In this manner, the first arm unit 14a can exchange the processed substrate W and the unprocessed substrate W.

Described below is the delivery of the substrate W between the second transfer robot 14 and the processing chamber 15a (the first processing chamber 15a and the second processing chamber 15a).

The first arm unit 14a, which does not grip the substrate W, takes out an unprocessed substrate W from the buffer unit 13 with the lower side (each of the lower claws 21b2, each of the lower claws 22b2), and heads toward the first processing chamber 15a. In the first processing chamber 15a, the second arm unit 14b, which does not grip the substrate W, holds the processed substrate W subjected to the first process from the first processing chamber 15a with the lower side (each of the lower claws 21b2, each of the lower claws 22b2) or the upper side (each of the upper claws 21b1, each of the upper claws 22b1) to take it out. Then, the first arm unit 14a, which holds the unprocessed substrate W on the lower side, sets the unprocessed substrate W in the first processing chamber 15a.

The second arm unit 14b, which holds the processed substrate W on the lower side (each of the lower claws 21b2, each of the lower claws 22b2) or the upper side (each of the upper claws 21b1, each of the upper claws 22b1) turns 180° to head to the second processing chamber 15a facing the first processing chamber 15a. In the second processing chamber 15a, first, the first arm unit 14a, which does not grip the substrate W, holds the processed substrate W subjected to the second process from the second processing chamber 15a with the upper side (each of the upper claw s21b1, each of the upper claws 22b1) to take it out. Then, the second arm unit 14b, which holds the processed substrate W subjected to the first process in the first processing chamber 15a with the lower side (each of the lower claws 21b2, each of the lower claws 22b2) or the upper side (each of the upper claws 21b1, each of the upper claws 22b1), sets the processed substrate W in the second processing chamber 15a.

In the substrate transfer step as described above, to transfer the processed substrate W to the buffer unit 13, the first arm unit 14a moves to the buffer unit 13, extends the arm 24, and places the processed substrate W in the buffer unit 13. Then, the first arm unit 14a descends and holds the next unprocessed substrate W with the lower side (each of the lower claws 21b2, each of the lower claws 22b2). In this manner, after placing the processed substrate W on the buffer unit 13, the first arm unit 14a can descend to a height at which it holds the unprocessed substrate W without changing the horizontal position of the arm 24, and contract the arm 24 after gripping the unprocessed substrate W. Thus, although the first arm unit 14a, i.e., the hand is taken in and out twice in the conventional manner, the number of times can be reduced to once. Thereby, the substrate transfer time can be shortened. Further, since the processed substrate W and the unprocessed substrate W can be exchanged without changing the horizontal position of the arm 24, there is no need to adjust horizontal alignment. This simplifies the control of the gripping part 23, and shortens the substrate transfer time. As a result, the substrate processing apparatus 10 can process an increased number of substrates, and the productivity is improved. The second transfer robot 14 can hold the substrate W at four points (the upper side and the lower side of the first arm unit 14a, the upper side and the lower side of the second arm unit 14b).

Further, since the substrate W can be gripped on the upper side and the lower side of one arm unit (the first arm unit 14a), it is possible to separate the members (the horizontal plane of the hand and the claws) for holding the unprocessed substrate W from those (the horizontal plane of the hand and the claws) for holding the processed substrate W. Thus, it is possible to prevent contaminants (particles) adhering to the unprocessed substrate W from adhering to the processed substrate W via the first arm unit 14a. Besides, since the unprocessed substrate W is held on the lower side, and the processed substrate is held on the upper side, contaminants adhering to the unprocessed substrate W are prevented from dropping on the processed substrate W by gravity and adhering thereto. Thus, the substrate W can be transferred to the buffer unit 13 with less substrate transfer time while the processed substrate W is kept clean.

As described above, according to the first embodiment, there are provided the first claw 21b having the abutment surfaces M1 (M1a, M1b) which abut on the outer peripheral surface of the substrate W one above the other, the first gripping plate 21 that supports the first claw 21b, the second claw 22b having the abutment surface M2 (M2a, M2b) which abut on the outer peripheral surface of the substrate W one above the other, and the gripping part 23 configured to move the first gripping plate 21 and the second gripping plate 22 relative to each other in the horizontal direction. Thus, it is possible to hold the substrate on both sides (upper side and lower side) of the hands of the first gripping plate 21 and the second gripping plate 22. For example, a hand holding the processed substrate W on the upper side can place the processed substrate W in the buffer unit 13, and can descend to grip the next unprocessed substrate W on the lower side. Thus, although the hand is taken in and out twice in the conventional manner, the number of times can be reduced to once. Thereby, the substrate transfer time can be shortened.

Second Embodiment

A second embodiment is described with reference to FIGS. 13 to 19. The second embodiment is basically similar to the first embodiment except the presence of a substrate lifting part. In the following, the difference is described, and the same description is not repeated.

Figure 13:
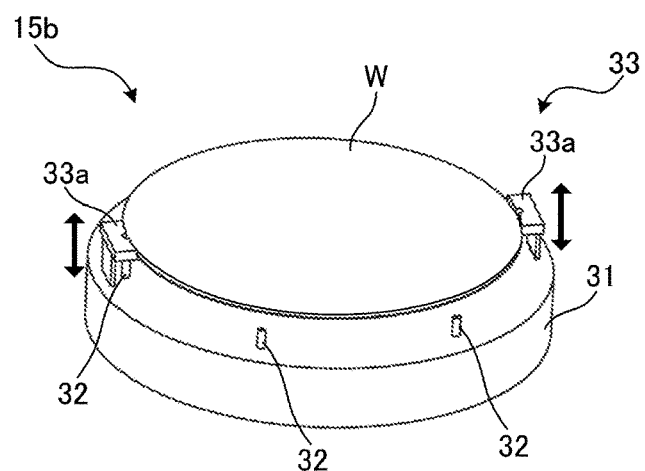
FIG. 13 is a perspective view illustrating a substrate holding part of a substrate processing apparatus according to a second embodiment.

As illustrated in FIG. 13, the substrate holding part 15b of the second embodiment includes a substrate processing table 31, a plurality of support members 32, and a substrate lifting part 33. As in the first embodiment, the substrate holding part 15b is provided in the processing chamber 15a of the substrate processing unit 15.

Each of the support members 32 supports the substrate W from the lower surface. For example, the support members 32 are arranged annularly, and are located on the surface of the substrate processing table 31.

The substrate lifting part 33 is provided on the substrate processing table 31 so as to be able to support the substrate W from the outside of each of the support members 32. The substrate lifting part 33 has a plurality of (two in the example of FIG. 13) lifting members 33a for supporting the substrate W. The lifting members 33a are formed to be movable in the up-and-down direction. Thus, the substrate W supported by the support members 32 are held by the lifting members 33a and moved in the up-and-down direction along with the up and down movement of the lifting members 33a.

The substrate lifting part 33 may not be located on the substrate processing table 31 as long as it can support the substrate W from the outside of each of the support members 32, and it may be located outside the substrate processing table 31. In this case, the substrate lifting part 33 can be arranged at the bottom of the substrate processing unit 15.

In the substrate holding part 15b, upon delivery of the substrate W, the processed substrate W is held by the substrate lifting part 33 and moved to a predetermined maximum height position. With this, the first arm unit 14a can enter below the processed substrate W. Thereby, the substrates W can be replaced by only the first arm unit 14a in the processing chamber 15a. In the first embodiment described above, the processed substrate W in the processing chamber 15a is taken out by one arm unit (the second arm unit 14b) and the unprocessed substrate W is set by the other arm unit (the first arm unit 14a) to exchange the substrates.

(Substrate Transfer Process by Second Transfer Robot)

In the following, the delivery of the substrates W between the second transfer robot 14 and the processing chamber 15a is described with reference to FIGS. 14 to 19.

Figure 14:
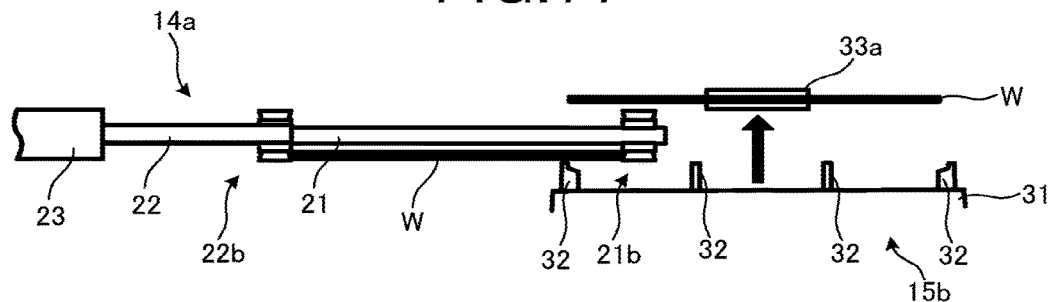
FIG. 14 is a first explanatory diagram for explaining a flow of a second transfer operation (transfer to a processing chamber) of the transfer robot of the second embodiment.

As illustrated in FIG. 14, to transfer the processed substrate W to the processing chamber 15a, each of the lifting members 33a of the substrate holding part 15b for holding the processed substrate W is moved upward to a position where the first arm unit 14a can be inserted between the upper end surface of the lifting member 33a and the support member 32. The first arm unit 14a, whose height position is defined between the upper end surface of the lifting member 33a and the upper end surface of the support member 32, enters between the upper end surface of the lifting member 33a and the upper end surface of the support member 32, and stops on the substrate processing table 31. At this time, the first arm unit 14a is gripping the unprocessed substrate W on the lower side (each of the lower claws 21b2, each of the lower claws 22b2).

Figure 15:
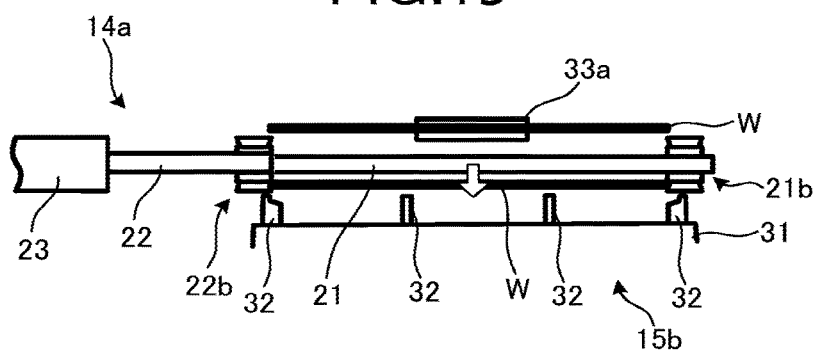
FIG. 15 is a second explanatory diagram for explaining a flow of the second transfer operation.
Figure 16:
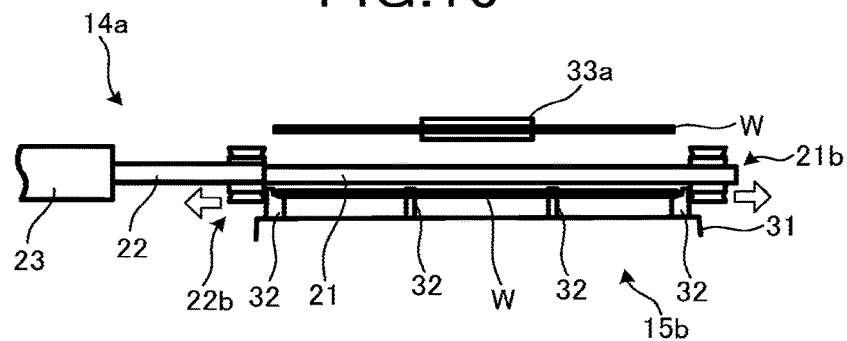
FIG. 16 is a third explanatory diagram for explaining a flow of the second transfer operation.
Figure 17:
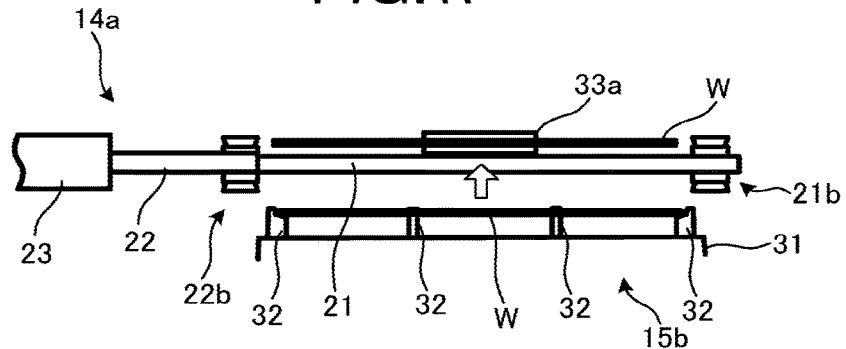
FIG. 17 is a fourth explanatory diagram for explaining a flow of the second transfer operation.
Figure 18:
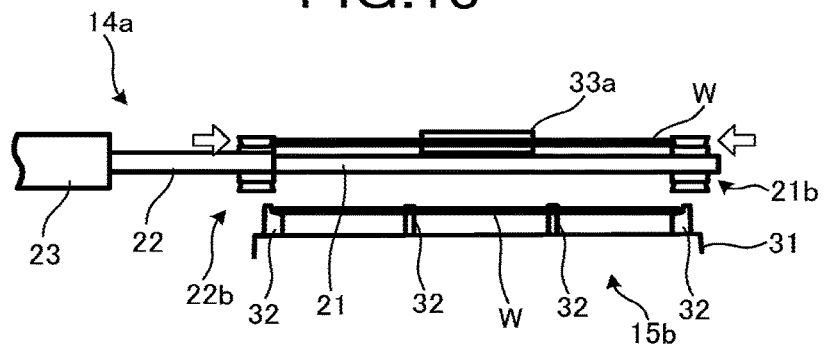
FIG. 18 is a fifth explanatory diagram for explaining a flow of the second transfer operation.
Figure 19:
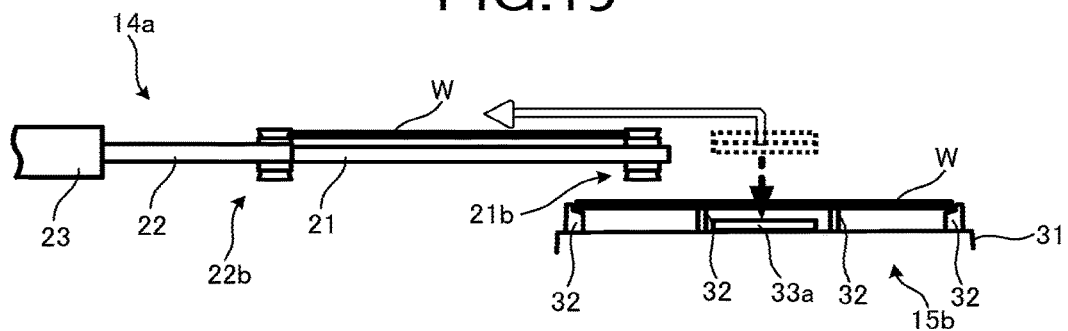
FIG. 19 is a sixth explanatory diagram for explaining a flow of the second transfer operation.

Thereafter, as illustrated in FIG. 15, the unprocessed substrate W is placed on each of the support members 32 of the processing chamber 15a by the first arm unit 14a which holds the unprocessed substrate W on the lower side. Next, as illustrated in FIG. 16, the grip by the first arm unit 14a is released, and the unprocessed substrate W is supported by each of the support members 32. After that, as illustrated in FIG. 17, the first arm unit 14a is raised to a gripping position where the first arm unit 14a grips the processed substrate W on the pair of lifting members 33a. Then, as illustrated in FIG. 18, the first arm unit 14a raised to the gripping position grips the processed substrate W on the pair of lifting members 33a. Thereafter, as illustrated in FIG. 19, when the pair of lifting members 33a is moved downward, the first arm unit 14a holding the processed substrate W on the upper side retreats from above the substrate holding part 15b, and is takes out the unprocessed substrate W from the processing chamber 15a. In this manner, the first arm unit 14a can exchange the unprocessed substrate W and the processed substrate W.

In this substrate transfer process, the first arm unit 14a grips the unprocessed substrate W on the lower side and moves to a position above the substrate processing table 31 of the processing chamber 15a to set the unprocessed substrate W to each of the support members 32 of the substrate processing table 31. Thereafter, the first arm unit 14a is raised to a gripping position where the first arm unit 14a grips the processed substrate W without holding the substrate W. Then, the first arm unit 14a grips the processed substrate W on the upper side and takes it out from the processing chamber 15a. Thus, although the first arm unit 14a, i.e., the hand is taken in and out twice in the conventional manner, the number of times can be reduced to once. Thereby, the substrate transfer time can be shortened. As a result, the substrate processing apparatus 10 can process an increased number of substrates, and the productivity is improved.

Further, since the substrate W can be held on the upper side and the lower side of one arm unit (the first arm unit 14a), it is possible to separate the members (the horizontal plane of the hand and the claws) for holding the unprocessed substrate W from those (the horizontal plane of the hand and the claws) for holding the processed substrate W. Thus, it is possible to prevent contaminants (particles) adhering to the unprocessed substrate W from adhering to the processed substrate W via the first arm unit 14a. Besides, since the unprocessed substrate W is held on the lower side, and the processed substrate is held on the upper side, contaminants adhering to the unprocessed substrate W are prevented from dropping on the processed substrate W by gravity and adhering thereto. Thus, the substrate W can be transferred to the buffer unit 13 with less substrate transfer time while the processed substrate W is kept clean.

As described above, according to the second embodiment, it is possible to achieve the same effects as those of the first embodiment. Further, with the substrate lifting part 33 in the processing chamber 15a, substrates can be exchanged by one arm unit (the arm units 14a, 14b) in both the buffer unit 13 and the processing chamber 15a. Thus, the substrate transfer time can be further shortened.

Other Embodiments

In each of the above embodiments, an example is described in which both of the upper and lower arm units 14a and 14b are provides with the upper and lower claws (the first claw 21b and the second claw 22b); however, it is not so limited. For example, only the upper arm unit 14a may be provided with the claws. Further, the first claw 21b and the second claw 22b can have the same structure, and the first transfer robot 12 may employ the structure of the second transfer robot 14. The number of upper and lower claws (the first claw 21b and the second claw 22b) is not particularly limited, and two or more of them are sufficient.

In each of the above embodiments, an example is described in which both the first gripping plate 21 and the second gripping plate 22 are moved; however, it is not so limited. For example, only one of the first gripping plate 21 and the second gripping plate 22 may be moved.

In each of the above embodiments, the use of two types of the processing chambers 15a is described as an example; however, it is not so limited. For example, three types of the processing chambers 15a may be used. In this case, after processes 1, 2 and 3 are performed in order, the processed substrate W is returned to the buffer unit 13. For example, assuming that the process 2 takes time twice as long as that required for the process 1 or the process 3, twice as many as (four) processing chambers (15a) may be used to perform the process 2. For another example, one type of the processing chambers 15a may also be used. In this case, as soon as the process 1 is completed, the processed substrate W is returned to the buffer unit 13.

In the above embodiments, an example is described in which the processed substrate W is held on the upper side and the unprocessed substrate W is held on the lower side; however, it is not so limited, and the sides may be reversed. That is, the unprocessed substrate W may be held on the upper side, and the processed substrate W may be held on the lower side. In this case, the unprocessed substrate W is placed on the placement table member 13a above the height position where the arm units 14a and 14b are inserted into the buffer unit 13, and the processed substrate W is placed on the lower placement table member 13a. Further, the substrate lifting part 33 may be lowered after the unprocessed substrate W is placed on the substrate lifting part 33 and the processed substrate W is taken out from each of the support members 32 to deliver the unprocessed substrate W to each of the support members 32.

In the above-described embodiments, an example is described in which the second arm unit 14b has the same structure as the first arm unit 14a. However, when there are only a few types of processes (e.g., two or less processes) performed in the processing chamber 15a, the second arm unit 14b, which transfers the substrates W between the processing chambers 15a, may be formed to hold the substrates with only one of the upper side (each of the upper claws 21b1, each of the upper claws 22b1) or the lower side (each of the lower claws 21b2, each of the lower claws 22b2). In this case, the other claws that are not used can be appropriately omitted.

In the above embodiments, an example is described in which the first arm unit 14a and the second arm unit 14b are raised and lowered by the lifting and rotating part 14d so that the substrate W can be placed on the placement table member 13a of the buffer unit 13, or the substrate W can be taken out from the placement table member 13a; however, it is not so limited. It is sufficient if the positions of the arm units 14a and 14b can be changed relative to each other with respect to a direction in which the substrates W are stacked in the buffer unit 13 (the arrangement direction of the pair of the placement table members 13a). For example, the buffer unit 13 may be provided with an lifting part so that the buffer unit 13 can be raised and lowered in the direction in which the substrates W are stacked. In this case, the buffer unit 13 is raised or lowered in a direction opposite to the direction of the up or down movement of the arm units 14a and 14b for placing or taking out the substrate W. In this case, it is also possible to omit the lifting part that raises and lowers each of the arm units 14a and 14b in the above embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate transfer apparatus, comprising:
    a first gripping plate;
    a first claw fixedly supported by the first gripping plate, and has an abutment surface, which abuts on an outer peripheral surface of a substrate, located above and below a surface of the first gripping plate;
    a second gripping plate overlapping the first gripping plate;
    a second claw fixedly supported by the second gripping plate, and has an abutment surface, which abuts on the outer peripheral surface of the substrate, located above and below the surface of the first gripping plate; and
    a gripper to move both the first gripping plate and the second gripping plate such that both the first claw and the second claw move to approach and separate from each other in a direction intersecting the outer peripheral surface of the substrate,
    wherein the gripper includes
        a support plate,
        a linear guide supported by the support plate and extending in a direction in which the first claw and the second claw move to approach and separate from each other, a first linear motion block fixed to the first gripping plate and configured to be movable along the linear guide,
a second linear motion block fixed to the second gripping plate and configured to be movable along the linear guide,
a cylinder connected to one of the first gripping plate and the second gripping plate to move the one of the gripping plates in the direction in which the first claw and the second claw move to approach and separate from each other, and
a swing pin mover configured to convert and transmit the movement of the one of the gripping plates caused by the cylinder to the other of the gripping plates such that the other of the gripping plates moves in a direction opposite to the movement of the one of the gripping plates.

2. The substrate transfer apparatus of claim 1, wherein the first claw includes:
an upper claw arranged on an upper surface of the first gripping plate, and has the abutment surface; and
a lower claw arranged on a lower surface of the first gripping plate, and has the abutment surface.

3. The substrate transfer apparatus of claim 1, further comprising:
a lifter to move the gripper up and down; and
a controller configured to control the lifter,
wherein the controller is further configured to control the lifter to move the gripper up or down such that the first claw and the second claw are moved from a first height position for placing a first substrate to a second height position for gripping a second substrate located above or below the first substrate, and then control the gripper to move both the first gripping plate and the second gripping plate.

4. The substrate transfer apparatus of claim 3, further comprising an arm to move the gripper in horizontal direction,
wherein the controller is further configured to
control the arm to move the gripper to a first position at the first height position where the substrate is placed by the first claw and the second claw,
control the gripper located at the first position to move both the first gripping plate and the second gripping plate in a direction in which both the first claw and the second claw separate from each other,
control the lifter to move the gripper to a second position at the second height position where the first claw and the second claw are located below the first height position without changing horizontal positions of the first gripping plate and the second gripping plate, and
control the gripper located at the second position to move both the first gripping plate and the second gripping plate in a direction in which both the first claw and the second claw move to approach each other.

5. The substrate transfer apparatus of claim 1, wherein the second connecting plate includes first and second through holes, the first through hole being smaller than the second through hole,
wherein the first connecting plate includes third and fourth through holes, the fourth through hole being smaller than the third through hole,
wherein the swing pin mover includes a rotator disposed on the support plate and rotatable around a center of the rotator as a rotation axis, and first and second swing pins provided on the rotator and facing each other through the rotation axis, and
wherein the first swing pin passes through the first through hole and the third through hole, and the second swing pin passes through the second through hole and the fourth through hole.

6. A substrate processing apparatus, comprising:
a storage to store a plurality of substrates stacked at predetermined intervals;
a substrate transfer apparatus to transfer the substrates; and
a substrate processor configured to process the substrates,
wherein the substrate transfer apparatus includes:
a first gripping plate;
a first claw fixedly supported by the first gripping plate, and has an abutment surface, which abuts on an outer peripheral surface of a substrate, located above and below a surface of the first gripping plate;
a second gripping plate overlapping the first gripping plate;
a second claw fixedly supported by the second gripping plate, and has an abutment surface, which abuts on the outer peripheral surface of the substrate, located above and below the surface of the first gripping plate; and
a gripper to move both the first gripping plate and the second gripping plate such that both the first claw and the second claw move to approach and separate from each other in a direction intersecting the outer peripheral surface of the substrate, and wherein the gripper includes
a support plate,
a linear guide supported by the support plate and extending in a direction in which the first claw and the second claw move to approach and separate from each other,
a first linear motion block fixed to the first gripping plate and configured to be movable along the linear guide,
a second linear motion block fixed to the second gripping plate and configured to be movable along the linear guide,
a cylinder connected to one of the first gripping plate and the second gripping plate to move the one of the gripping plates in the direction in which the first claw and the second claw move to approach and separate from each other, and
a swing pin mover configured to convert and transmit the movement of the one of the gripping plates caused by the cylinder to the other of the gripping plates such that the other of the gripping plates moves in a direction opposite to the movement of the one of the gripping plates.

7. The substrate processing apparatus of claim 6, wherein the first claw includes:
an upper claw arranged on an upper surface of the first gripping plate, and has the abutment surface; and
a lower claw arranged on a lower surface of the first gripping plate, and has the abutment surface.

8. The substrate processing apparatus of claim 6, further comprising:
a lifter to move the gripper up and down; and
a controller configured to control the lifter,
wherein the controller is further configured to control the lifter to move the gripper up or down such that the first claw and the second claw are moved from a first height position for placing a first substrate to a second height position for gripping a second substrate located above or below the first substrate, and then control the gripper to move both the first gripping plate and the second gripping plate.

9. The substrate processing apparatus of claim 8, further comprising an arm to move the gripper in a horizontal direction,
wherein the controller is further configured to
control the arm to move the gripper to a first position at the first height position where the substrate is placed by the first claw and the second claw,
control the gripper located at the first position to move both the first gripping plate and the second gripping plate in a direction in which both the first claw and the second claw separate from each other,
control the lifter to move the gripper to a second position at the second height position where the first claw and the second claw are located below the first height position without changing horizontal positions of the first gripping plate and the second gripping plate, and
control the gripper located at the second position to move both the first gripping plate and the second gripping plate in a direction in which both the first claw and the second claw move to approach each other.

10. The substrate processing apparatus of claim 6, wherein the substrate processor includes:
a substrate processing table;
a plurality of support members arranged on the substrate processing table to support the substrate from a lower surface thereof; and
a substrate lifter to support the substrate from an outer side of the support members, and move the substrate up and down.

11. The substrate processing apparatus of claim 6, wherein the second connecting plate includes first and second through holes, the first through hole being smaller than the second through hole,
wherein the first connecting plate includes third and fourth through holes, the fourth through hole being smaller than the third through hole,
wherein the swing pin mover includes a rotator disposed on the support plate and rotatable around a center of the rotator as a rotation axis, and first and second swing pins provided on the rotator and facing each other through the rotation axis, and
wherein the first swing pin passes through the first through hole and the third through hole, and the second swing pin passes through the second through hole and the fourth through hole.

12. A substrate processing method, comprising:
removing a first substrate from a storage that stores a plurality of substrates stacked at predetermined intervals using a substrate transfer apparatus that includes
a first gripping plate,
a first claw fixedly supported by the first gripping plate, and has an abutment surface, which abuts on an outer peripheral surface of a substrate, located above and below a surface of the first gripping plate,
a second gripping plate overlapping the first gripping plate,
a second claw fixedly supported by the second gripping plate, and has an abutment surface, which abuts on the outer peripheral surface of the substrate, located above and below the surface of the first gripping plate, and
a gripper to move both the first gripping plate and the second gripping plate such that both the first claw and the second claw move to approach and separate from each other in a direction intersecting the outer peripheral surface of the substrate,
wherein the gripper includes
a support plate,
a linear guide supported by the support plate and extending in a direction in which the first claw and the second claw move to approach and separate from each other,
a first linear motion block fixed to the first gripping plate and configured to be movable along the linear guide,
a second linear motion block fixed to the second gripping plate and configured to be movable along the linear guide,
a cylinder connected to one of the first gripping plate and the second gripping plate to move the one of the gripping plates in the direction in which the first claw and the second claw move to approach and separate from each other, and
a swing pin mover configured to convert and transmit the movement of the one of the gripping plates caused by the cylinder to the other of the gripping plates such that the other of the gripping plates moves in a direction opposite to the movement of the one of the gripping plates;
performing a process on the first substrate removed from the storage;
storing the first substrate subjected to the process in the storage using the substrate transfer apparatus;
removing a second substrate located above or below the first substrate from the storage using the substrate transfer apparatus;
performing a process on the second substrate removed from the storage; and
storing the second substrate subjected to the process in the storage using the substrate transfer apparatus.

13. The substrate processing method of claim 12, wherein the second connecting plate includes first and second through holes, the first through hole being smaller than the second through hole,
wherein the first connecting plate includes third and fourth through holes, the fourth through hole being smaller than the third through hole,
wherein the swing pin mover includes a rotator disposed on the support plate and rotatable around a center of the rotator as a rotation axis, and first and second swing pins provided on the rotator and facing each other through the rotation axis, and
wherein the first swing pin passes through the first through hole and the third through hole, and the second swing pin passes through the second through hole and the fourth through hole.

* * * * *